United States Patent [19]

Aoki

[11] Patent Number: 5,780,918
[45] Date of Patent: Jul. 14, 1998

[54] SEMICONDUCTOR INTEGRATED CIRCUIT DEVICE HAVING A PROGRAMMABLE ADJUSTING ELEMENT IN THE FORM OF A FUSE MOUNTED ON A MARGIN OF THE DEVICE AND A METHOD OF MANUFACTURING THE SAME

[75] Inventor: Kanji Aoki, Suwa, Japan

[73] Assignee: Seiko Epson Corporation, Tokyo, Japan

[21] Appl. No.: 695,975

[22] Filed: Aug. 12, 1996

Related U.S. Application Data

[63] Continuation of Ser. No. 241,461, May 11, 1994, abandoned, which is a continuation of Ser. No. 873,239, Apr. 24, 1992, abandoned, which is a continuation-in-part of Ser. No. 705,012, May 22, 1991, abandoned.

[30] Foreign Application Priority Data

| May 22, 1990 | [JP] | Japan | 2-132263 |
| Oct. 2, 1990 | [JP] | Japan | 2-264094 |
| Apr. 11, 1991 | [JP] | Japan | 3-078778 |

[51] Int. Cl.$^6$ .................................... H01L 29/00
[52] U.S. Cl. .................................... 257/529; 438/467
[58] Field of Search .................................... 257/529, 530

[56] References Cited

U.S. PATENT DOCUMENTS

| 3,758,761 | 9/1973 | Henrion | 257/529 |
| 3,976,983 | 8/1976 | Moussie | 257/529 |
| 4,045,310 | 8/1977 | Jones et al. | 257/529 |
| 4,446,534 | 5/1984 | Smith | 365/200 |
| 4,455,194 | 6/1984 | Yabu et al. | 257/529 |
| 4,547,830 | 10/1985 | Yamauchi . | |
| 4,628,590 | 12/1986 | Udo et al. | 257/529 |
| 4,689,550 | 8/1987 | Ujihara et al. . | |
| 4,796,075 | 1/1989 | Whitten | 237/529 |
| 4,833,650 | 5/1989 | Hirayama et al. | 365/225.7 |
| 4,879,587 | 11/1989 | Jerniz et al. | 257/529 |
| 5,018,101 | 5/1991 | Kajigaya et al. | 365/51 |
| 5,050,238 | 9/1991 | Tomizuka et al. . | |
| 5,086,331 | 2/1992 | Hartgring et al | 257/530 |
| 5,204,559 | 4/1993 | Deyhimy et al. | 307/269 |
| 5,233,064 | 8/1993 | Hotta et al. | 307/269 |
| 5,493,148 | 2/1996 | Ohata et al. | 257/529 |

FOREIGN PATENT DOCUMENTS

| 0241046 | 10/1987 | European Pat. Off. | 257/529 |

OTHER PUBLICATIONS

R. F. Broom et al. "Discretionary Interconnection Method for Integrated Circuits", *IBM Technical Disclosure Bulletion*, vol. 14, No. 11 (Apr. 1972) pp. 3549–3550.

Primary Examiner—J. Carroll
Attorney, Agent, or Firm—Loeb & Loeb LLP

[57] ABSTRACT

An input part of a semiconductor integrated circuit includes a fuse element formed from a metal wiring layer and connected between an input pad and a source line is formed from wiring material. The wiring material is aluminum, possibly doped with silicon. The fuse element is narrowed or thinned at a location remote from an internal circuit. The stability and certainty of the melting properties of the fuse element at the narrowed of thinned location is improved even when the device is sealed with resin, without interfering with the manufacturing process, and at the same time the desired fuse element properties are retained. Consequently, the operating characteristics of the internal circuit can be adjusted highly precisely and with certainty after the assembly of the integrated circuit into a package.

7 Claims, 11 Drawing Sheets

DIVIDING DIAGRAM WHEN S AND R INPUT "0"

SEMICONDUCTOR INTEGRATED CIRCUIT DEVICE HAVING A PROGRAMMABLE ADJUSTING ELEMENT IN THE FORM OF A FUSE MOUNTED ON A MARGIN OF THE DEVICE AND A METHOD OF MANUFACTURING THE SAME

RELATED APPLICATION

This is a continuation of application Ser. No. 08/241,461 filed May 11, 1994, and now abandoned, which is a continuation of application Ser. No. 07/873,239 filed on Apr. 24, 1992, also abandoned, which is itself a continuation-in-part of application Ser. No. 07/705,012, filed on May 22, 1991, also abandoned.

BACKGROUND OF THE INVENTION

1. Field of the Invention

The present invention relates to a semiconductor integrated circuit device having an internal adjustment input part with fuse elements which can be melted by applying voltage from an external source after the circuit has been encapsulated, or sealed within a package, and an internal circuit whose operation is adjusted on the basis of adjusting signals output by the internal adjustment input part. More particularly, the present invention relates to the properties of the fuse elements in the internal adjustment input part, and the circuit composition of the internal adjustment input part.

2. Prior Art

Conventionally, there are known semiconductor integrated circuits formed on a chip and whose internal circuit configuration and operation potential and so on can be modified by applying a voltage to an external terminal after the circuit has been packaged by sealing the semiconductor chip with resin.

For example, there are known EPROMs (Erasable and Programmable Read Only Memories) with built-in FAMOS's using a floating gate. EPROMs have the advantage that they can be written to and erased freely. However, they have the disadvantages of requiring a complicated manufacturing process to form the FAMOS's and having a high manufacturing cost.

On the other hand, as a semiconductor integrated circuit which can be manufactured at a low price, there are known PROMs (Programmable Read Only Memories), in which data can be written on the basis of the melting of one or more fuses. There are also known semiconductor integrated circuits in which there are multiple sets of fuses (fuse bits) to set up the logical state in an input part of an internal circuit and these fuses are selectively melted before the device is sealed with resin in order to adjust, for example, the oscillation frequency in an integrated circuit with a built-in crystal oscillator and the output voltage of a regulator.

Figure 8:
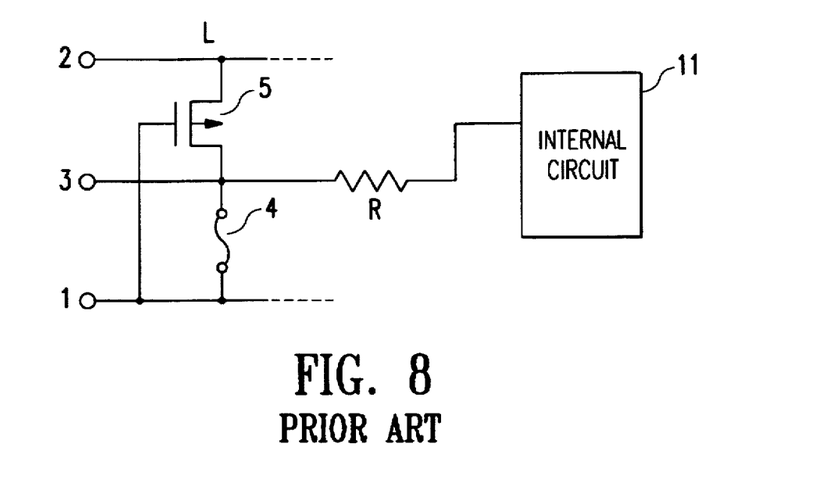
FIG. 8 is a circuit diagram showing the composition of an internal adjustment input part of a conventional semiconductor integrated circuit.

FIG. 8 shows a portion of the input part of an internal circuit. In FIG. 8, reference numeral 1 is a first terminal, or electrode, set at ground potential, reference numeral 2 is a second terminal, or electrode, connected to a power source supplying voltage at a level of 5 V, reference numeral 3 is an input terminal, or electrode, reference numeral 4 is a fuse element, and reference numeral 5 is a load MOS transistor. The resistance value of the source to drain path of load MOS 5 is of the order of scores of kΩ in the OFF state, and that of the fuse element 4 is of the order of scores of Ω when fuse element 4 is in its lower resistance condition. The electric potential for input terminal 3 is introduced to the internal circuit 11 through a resistance R.

2

In a device having a set of such fuse bits, although it is impossible to restore a fuse to its initial resistance condition once the fuse has been melted, there is the advantage that it can be produced at a low price.

It is known in the art to form such a fuse element from a polysilicon layer having an appropriate sheet resistance value, and to melt such a fuse element by conducting a sufficiently large current therethrough, as well as a fuse element, sometimes referred to as an anti-fuse, in which a thin film initially between polysilicon or metal layers initially constitutes an insulator and can be placed in a conductive state with a prescribed resistance value by applying an electric field having a sufficiently high intensity to destroy the insulating film.

Figure 7:
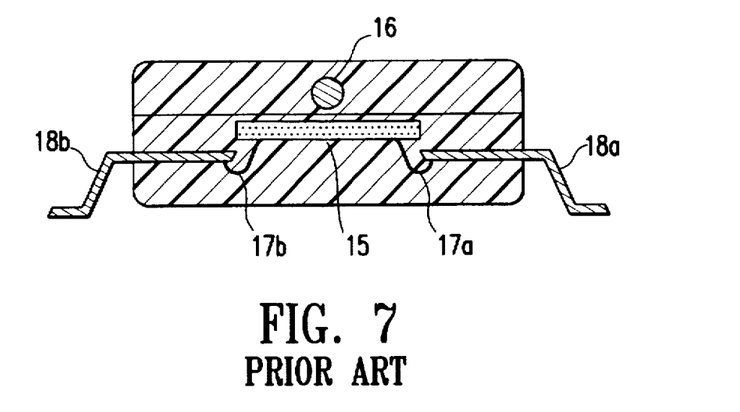
FIG. 7 is a cross-sectional view showing the composition of a package of a semiconductor integrated circuit having a crystal oscillator.

In a semiconductor integrated circuit with built-in fuses, prior to assembly of a package using resin or the like as a packaging material, the target internal circuit and so on are formed by partially cutting one or more selected fuse elements. In a semiconductor chip whose internal circuit is formed in this way, as seen in FIG. 7 which shows the package structure of a real-time clock having a crystal oscillator 16, after wires 17a, 17b are bonded and external terminals 18a, 18b are connected thereto, the semiconductor chip 15 carrying crystal oscillator 16 is sealed in resin. In molding the semiconductor chip with resin, however, stress resulting from the application of heat and/or pressure is imposed on the semiconductor chip 15 and the crystal oscillator 16 and so on. Therefore the resistance division ratio inside the internal circuit, the threshold voltage of an active element, or the oscillation frequency of the crystal oscillator and so on may change. As a result, the properties of the semiconductor integrated circuit deviate from the optimum value. Problems are also created by the fact that the properties of devices which are manufactured to be nominally identical can vary widely from one unit to the next.

A polysilicon fuse which can be melted prior to packaging is difficult to melt completely after the assembly of the package even if high voltage is applied on account of the mold material with which the semiconductor chip is coated. For example, it often happens that only the central part of the polysilicon layer responds in the desired manner to heating by the melting current and there remain uncut parts on both sides of that central part. Once this happens, the resistance value of the fuse becomes extremely high, so that it becomes very difficult to subsequently establish a current which is sufficiently high to melt the fuse completely.

Furthermore, in the case of a semiconductor integrated circuit in which one or more fuses are set up in the input part to adjust the internal circuit, even if the fuse bit is cut on the basis of the data of the internal circuit set up beforehand, there is the possibility that the properties of each semiconductor device vary on account of the variation of each circuit constant occurring in the manufacturing process and so on. Accordingly, if each device is adjusted identically, it is not always possible to set the oscillation frequency and output voltage of the internal circuit and so on to their optimum values.

SUMMARY OF THE INVENTION

It is a primary object of the present invention to provide a semiconductor integrated circuit device whose internal circuit can be adjusted regardless of changes effected in the operating characteristics of the device as a result of, for example, the packaging process.

A further object of the present invention is to ensure improved reliability in the melting of a fuse element for adjusting an internal circuit after the assembly of a package by forming the fuse elements of the semiconductor integrated circuit device from appropriate material.

Finally, an object of the present invention is to provide a semiconductor integrated circuit device whose operation can always be adjusted appropriately depending on whether a fuse is melted or not, regardless of variation in the operating characteristics of an internal circuit of the device from any cause, and so on.

The above and other objects are achieved, according to the present invention, by the provision of a semiconductor integrated circuit device composed of: an internal adjustment input part containing at least one fuse element which can be melted to change its resistance between two substantially different values by application thereto of a selected voltage or current supplied via an external terminal for causing the input part to output adjusting signals having a selected one of at least two different states depending on whether the fuse element is melted or not; and an internal circuit connected to the internal adjustment part for enabling at least one operating characteristic of the internal circuit to be adjusted on the basis of the state of the adjusting signals. The present invention is especially effective when the semiconductor integrated circuit structure is sealed with resin.

According to a further feature of the invention, it is desirable that a fuse element be formed from a wiring material such as aluminum, or an aluminum alloy containing at least one of Si, Cu, Ni, Co, Ti, and so on. In this case, it is desired that the lower resistance value of the fuse element be higher than 10 Ω.

It is effective to set up on this fuse element a meltable part whose cross-sectional area, perpendicular to the direction of current flow through the fuse element, is reduced compared to the remainder of the fuse element.

For example, in the case of a fuse element formed like a ribbon, the part to be melted is formed as a narrowed or thinned part of the ribbon.

Furthermore, it is desirable to locate the fuse element on the margin of the internal circuit and to form the part to be melted near the exterior edge of the fuse element.

These means are effective if they are applied to a semiconductor integrated circuit device having, as an internal circuit, a timing circuit equipped with a standard oscillation source, at least one frequency dividing circuit which divides the standard signals output by the standard oscillation source, and a controlling part which sends adjusting signals to the dividing circuit at prescribed intervals.

In addition, in further accordance with the invention, it is desirable that the fuse element be formed simultaneously with the wiring layer from aluminum or an aluminum alloy, which is also the material of the wiring layer. In this case, it is especially desirable to form the fuse element simultaneously with the lowest wiring layer of the semiconductor integrated circuit device. Furthermore, it is effective to form the fuse element on a stepped portion of the semiconductor integrated circuit device.

A semiconductor integrated circuit device according to the present invention has an input terminal which is electrically connected to a first source potential through a high resistance, at least one fuse element which is electrically connected between the input terminal and a second source potential and can be melted on the basis of the application of voltage or an electric current, an internal adjustment input part which outputs adjusting signals having a selected one of at least two different states depending on whether a fuse element is melted or not, and an internal circuit whose operating characteristics can be adjusted on the basis of the adjusting signals. The internal adjustment input part has a means to input test signals, and a means to select signals which, on the basis of controlling signals, selects either the adjusting signals or the test signals introduced from the means to input test signals, and which introduces the selected signals to the internal circuit. The internal adjustment input part has multiple fuse elements, and multiple means to select signals corresponding to the fuse element.

It is desirable for the means to input test signals to be composed of a shift register which outputs parallel test signals corresponding to multiple means to select signals. This composition is especially effective when, as an internal circuit, a timing circuit is adopted which has a standard oscillation source, at least one dividing circuit dividing the standard signals output by the standard oscillation source, and a controlling part sending adjusting signals to the dividing circuit at prescribed intervals.

BRIEF DESCRIPTION OF THE DRAWINGS

FIGS. 6-1 and 6-2 are waveform diagrams illustrating the operation of the circuit of FIG. 6.

Examples according to the present invention will be described below with reference to the attached drawings.

DESCRIPTION OF THE PREFERRED EMBODIMENTS

The present invention will now be described in greater detail with reference to several exemplary embodiments of the invention.

Example 1

Figure 1:
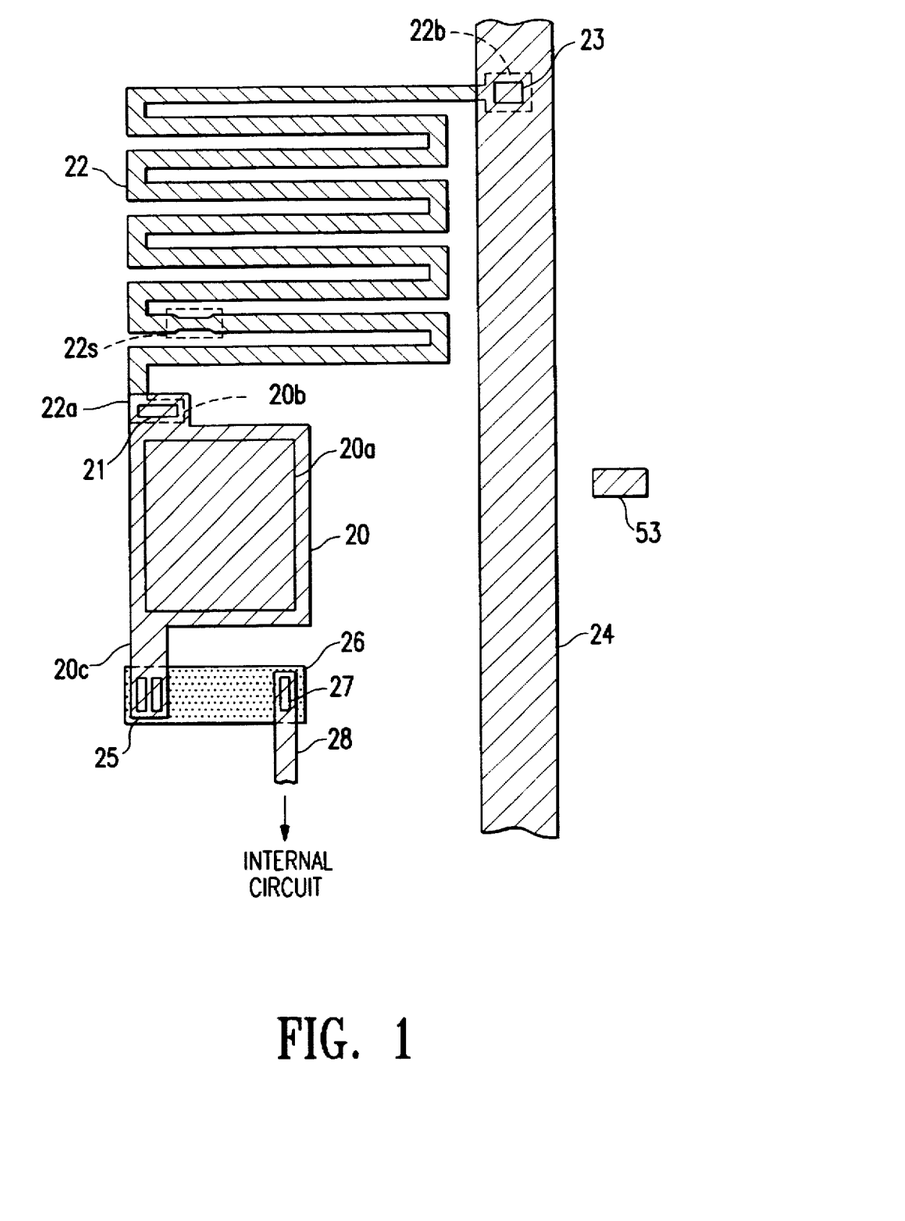
FIG. 1 is a plan view showing the topology of one preferred embodiment (Example 1) of an input adjustment part of a semiconductor integrated circuit according to the present invention.

FIG. 1 shows the layout of an input part of a semiconductor integrated circuit according to Example 1 of the present invention. The circuit includes an input part having upper and lower aluminum layers which are formed in the same process by which aluminum wiring of an internal circuit is formed. The input part includes an input pad 20 composed of an upper aluminum layer about 120 µm square having a pad opening 20a on its surface. A connection 20b which is formed together with the input pad 20 is electrically connected to one end 22a of a fuse member 22 formed on the lower aluminum layer through a contact hole 21, and the other end 22b of the fuse member 22 is electrically connected to a source line 24 to which ground potential is applied through a contact hole 23. The right part of source line 24 is a formation domain of an internal circuit.

Meanwhile, another connection 20c which is formed together with the upper layer of input pad 20 is connected through a contact hole 25 to a polysilicon resistance layer 26, the other end of which is connected to an electrostatic protective signal line 28 through a contact hole 27. The signal line 28 is further connected to the internal circuit through an electrostatic protective diode (not shown).

Fuse member 22 has a thickness of about 5000 Å, it is constituted by an aluminum alloy made by doping aluminum used as wiring material with 1% silicon, and its sheet resistivity is about 60 mΩ/square. Normally, the aluminum wiring of the lower layer is comparatively thin, and it is therefore appropriate for fuse member 22 to be formed in the thin lowest wiring layer of an IC in order to establish the required resistance value in an area as small as possible. The resistance value of fuse member 22 is of the order of 15 Ω, its width is about 5 µ, and its length is about 1.2 mm.

At a selected point along the length of fuse member 22, preferably in the region more remote from the internal circuit, at the left-hand side of FIG. 1, there is formed a narrowed part 22s having a width of the order of 3 µ. If the width of narrowed part 22s is selected to fit the value of the minimum size rule in a manufacturing process of a semiconductor integrated circuit, the widths of the other wiring parts of the fuse member 22 can be narrowed correspondingly; as a result, the area occupied by the fuse member 22 can be minimized.

The part of fuse member 22 which is cut as a result of melting is defined by narrowed part 22s, and since the wiring width is narrowed at that location, incomplete melting cannot occur. Hence, a fuse member having this form presents more stable melting properties. Furthermore, since the narrowed part 22s is spaced as much as is practicable from the internal circuit, even if a protective film of the IC is damaged by the heat required for melting, the internal circuit will hardly be affected.

It should be noted that the form of narrowed part 22s is not limited to that shown in FIG. 1 and described above; it is possible, for example, to provide several narrowed parts, and to assure that one of them is melted. It is also possible to set up a part which is thinner than the rest of the fuse member, instead of a narrow part 22s. Of course, it is possible to provide a part which has reduced width and thickness. Particularly, if the fuse member 22 is formed by the normal sputtering method or metallizing method on a stepped portion necessarily produced in a manufacturing process of an integrated circuit, such as the stepped portion formed between the formation domain and non-formation domain of a selective oxide film, or the stepped portion formed on the surface of an interlayer insulating film above the area between the lower formation domain and the non-formation domain of wiring, a thin part is naturally formed on the stepped portion, and it is therefore not necessary to intentionally change the shape of a mask pattern or an accumulation process.

The shape requirements of fuse member 22 are based on the following considerations:

(i) The fuse member 22 must be melted stably when voltage is applied from an external source.
(ii) The fuse member 22 must not be melted when it is connected to other input and output pins, that is to say it must not be melted when source voltage (5 V, in this example) is applied to an input pad.
(iii) The fuse member 22 must satisfactorily withstand an electric current from an input pad caused by static electricity. That is to say, as a standard, it must withstand a discharge test in which it is connected across a capacitance of 200 pF charged with 200 V (200 V, 200 pF, 0 Ω).
(iv) The fuse member 22 must maintain insulation properties after it is melted. In other words, it must sufficiently withstand the environment of high temperature and high humidity.

The melting voltage must be higher than 7 V, considering requirement (ii) and the margin associated with a 5 V source voltage. Meanwhile, the melting current of the fuse 22 must be less than 1 A, because it must be less than the melting current of bonding wires connected to a pad in a semiconductor integrated circuit. Under the conditions in regard to voltage and electric current, the resistance value must be adjusted to meet requirement (iii).

Figure 2:
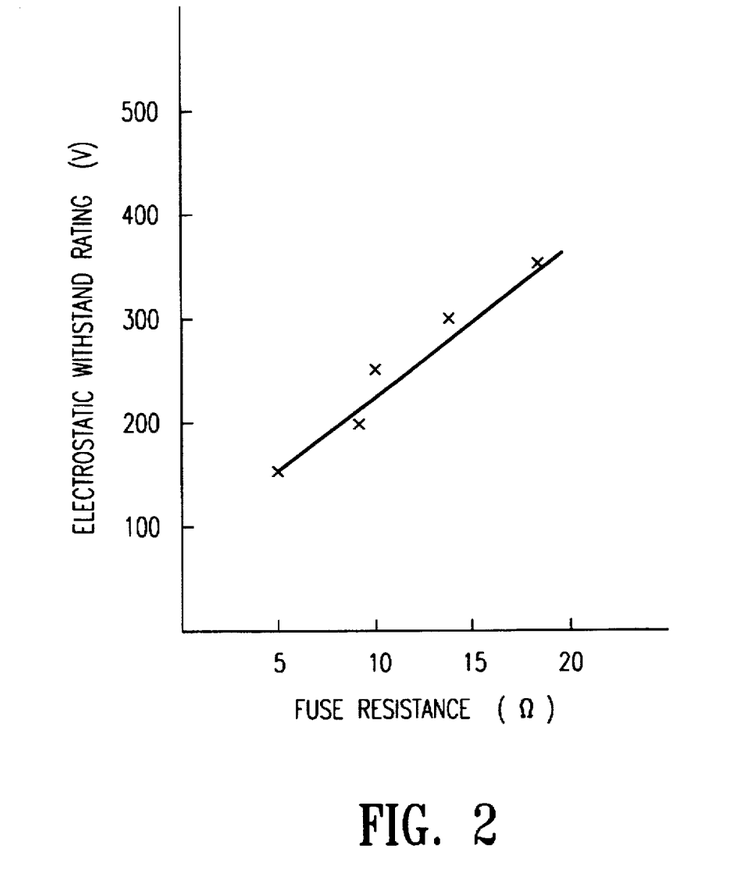
FIG. 2 is a graph showing the relation between the resistance value and the electrostatic breakdown rating in a fuse layer having the form shown in FIG. 1.

FIG. 2 represents graphically the electrostatic breakdown rating obtained in a discharge test performed with a capacitor having the parameters 200 pF, 0Ω, in which a plurality of fuse member samples all have the same width and thickness and are set to different resistance values by giving the various samples different lengths. According to FIG. 2, a fuse member with a starting resistance value of 8 Ω is melted at 200 V, and a fuse layer with a starting resistance value of 10 Ω is melted at 250 V. As a result, the resistance value of a fuse layer according to the invention must be greater than 10 Ω.

It should be noted that if the fuse member 22 has a narrow part 22s as described above, the value of its melting current is lower, but its electrostatic breakdown voltage is also lower compared with the case in which the fuse member 22 does not have a narrow part 22s but is otherwise identical. Accordingly, it is necessary to raise further the resistance value in view of this decrease in electrostatic breakdown voltage.

If the width of fuse member 22 is increased without changing its resistance value, although electrostatic breakdown voltage increases, the melting current increases. Therefore, the permissible width is limited by requirement (ii), above; moreover, the occupation area of the fuse layer must be increased to achieve a certain starting resistance value.

Based on the above consideration and requirements (i) and (iv), the size of fuse member 22 can be determined. The melting voltage of the fuse member 22 is 20 V, and the melting current is 600 mA. In the present example, by using silicon-doped aluminum of with a low resistance as the material of fuse member 22, undesired melting can be prevented. Furthermore, even if undesired partial melting occurs, the resistance value is not raised much by the rise in the resistance value caused by the residue in a bridge, so that the fuse can be melted, and there is a high certainty and stability of the melting operation.

Consequently, when an internal circuit is a real-time clock with a crystal oscillator and a regulator, it is possible to adjust the oscillation frequency and output voltage with certainty; hence, there will be an improvement in yield of a semiconductor integrated circuit. Since aluminum-silicon used in this example is a wiring material used to prevent diffusion of silicon, it can be formed simultaneously without a special process; accordingly, a semiconductor integrated circuit can be manufactured at low cost.

Figure 3:
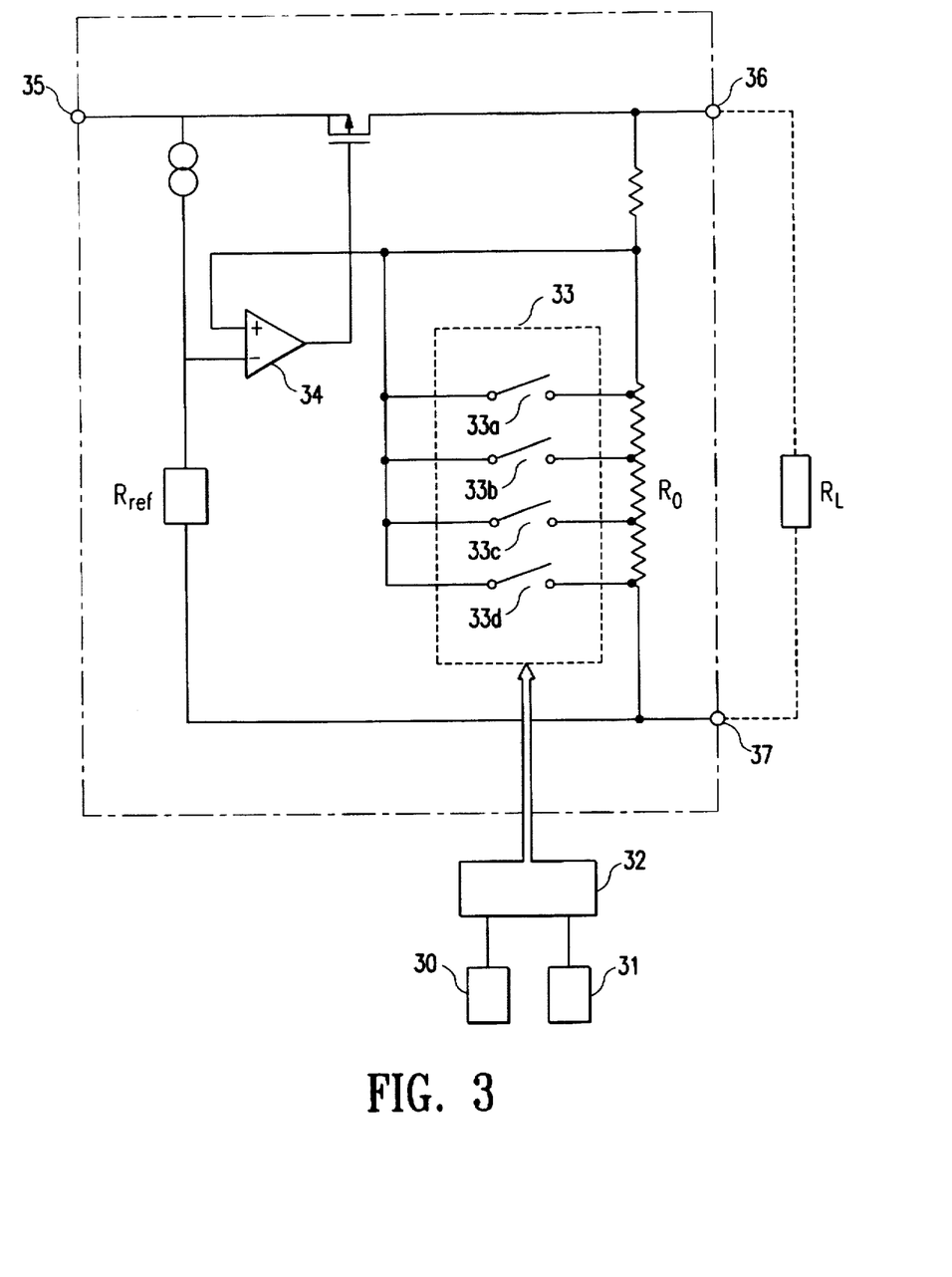
FIG. 3 is a circuit diagram of a series regulator whose output voltage can be adjusted by an input part as shown in FIG. 1.

FIG. 3 is a circuit diagram of a series regulator having input parts 30, 31 of the same structure as that of input part of FIG. 1. Here, on the basis of input voltage applied to an input terminal 35, a prescribed output voltage is generated between output terminals 36 and 37. To four division points of a resistor $R_0$ of this circuit are connected analog switches 33a, 33b, 33c and 33d, respectively, which constitute a switch block 33. The other ends of the respective analog switches 33a, 33b, 33c and 33d are connected to the noninverting input of a comparator 34. Two-bit information which is set up depending on whether respective fuse layers in the input parts 30, 31 are melted or not is introduced to the switch block 33 through a decoder 32, and closes one or more of the analog switches 33a–d to establish the state of switch block 33. In this way, it is possible to change the potential detection level of the regulator, determined by the effective resistance $R_0$ introduced to the noninverting input of comparator 34 depending on whether the fuse layer of each input part 30, 31 is melted or not; and it becomes possible to adjust output voltage correspondingly.

Example 2

Figure 4:
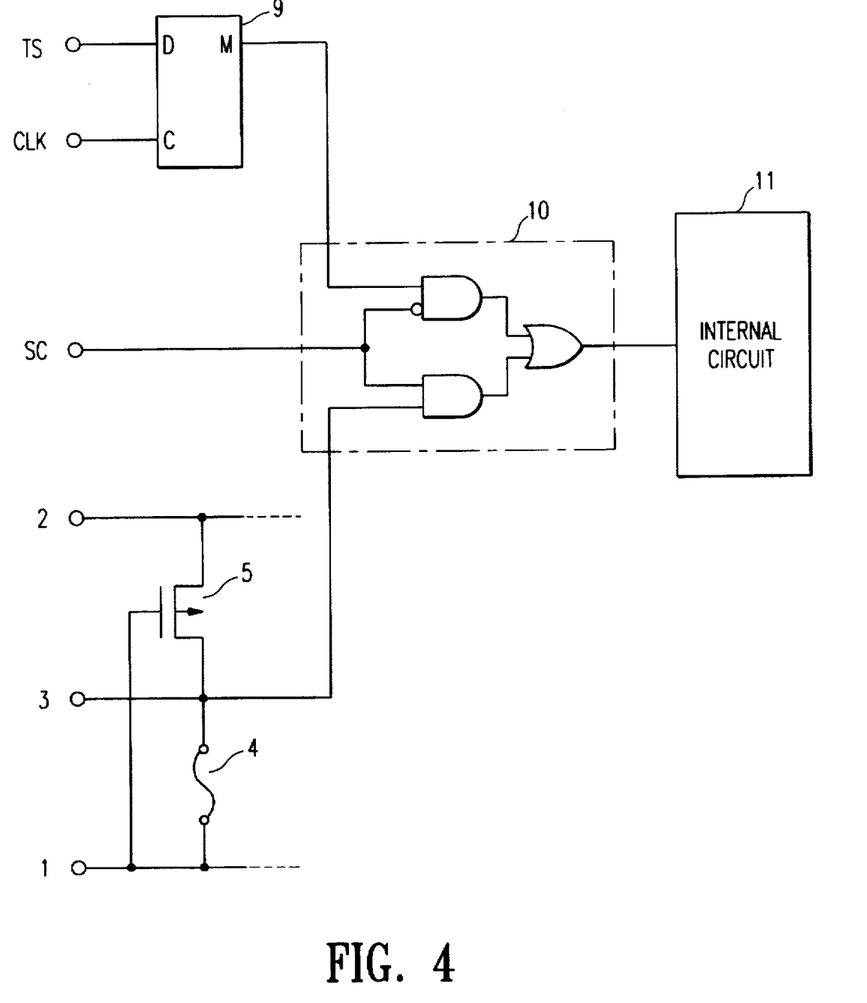
FIG. 4 is a circuit diagram showing the structure of a second preferred embodiment (Example 2) of an input adjustment part of a semiconductor integrated circuit according to the present invention.

Next, Example 2 according to the present invention will be described. In this example, a circuit of an input part of a semiconductor integrated circuit, the input part having a fuse element 4, as shown in FIG. 4 will be described first. In this example, the fuse element 4 is connected between a first power source supply terminal 1 and a signal input terminal 3, and a channel-type field-effect transistor 5 is connected between signal input terminal 3 and a second power source supply terminal 2. The fuse element 4 normally, i.e. initially, has a resistance of 10 to 20 Ω, and the source to drain path of field effect transistor 5 has an off resistance value which is sufficiently high relative to the resistance value of fuse element 4.

On the other hand, a latch register 9 to latch test signals TS which are input under control of clock signals CLK is set up as a means to input test signals, and the output line of the latch register 9 and an input line which extends from said input terminal 3 are introduced to a select circuit 10. Select circuit 10 is of conventional construction and is composed of two AND gates and an OR gate. When a selector controlling signal SC input to select circuit 10 is at logically high level, input signals from input terminal 3 are selected and are sent to an internal circuit 11. On the other hand, when selector controlling signal SC is at logically low level, the data of the latch register 9 is selected and is output to internal circuit 11 as adjusting input signals for internal circuit 11.

As a fuse element 4, a polysilicon layer is generally used, but an aluminum-silicon layer can also be used as described in connection with Example 1. The fuse element 4 may be an electric conductor or resistance which can be interrupted, or one which shorts by destroying a pn-junction, i.e. an anti-fuse, or one which is formed between layers of an electric conductor through an insulating film and which shorts by the breakdown of the insulating film, and so on.

As latch register 9, a latch circuit such as a D-flip-flop, a JK-flip-flop, or an RS-flip-flop can be used.

As internal circuit 11, a circuit detecting a fall in source voltage, or a regulator circuit can be used.

The output of select circuit 10 is used to set the resistance division ratio of a regulator circuit to a value corresponding to the bit number of the particular fuse element in order to adjust a detected voltage or regulation voltage. Of course, the output of circuit 10 can be used to control the frequency of clock signals in an integrated circuit with a built-in clock.

This example has the following effect: to adjust internal circuits, test signals TS are introduced to a latch register 9 first with selector controlling signal SC set at logically high level, and after confirming the operation of the internal circuit to the potential of the test signals, the input potential can be adjusted by selecting to change the state of, e.g. to melt or not, fuse element 4. Consequently, an adjustment error caused by variations of the internal circuit can be minimized.

Figure 5:
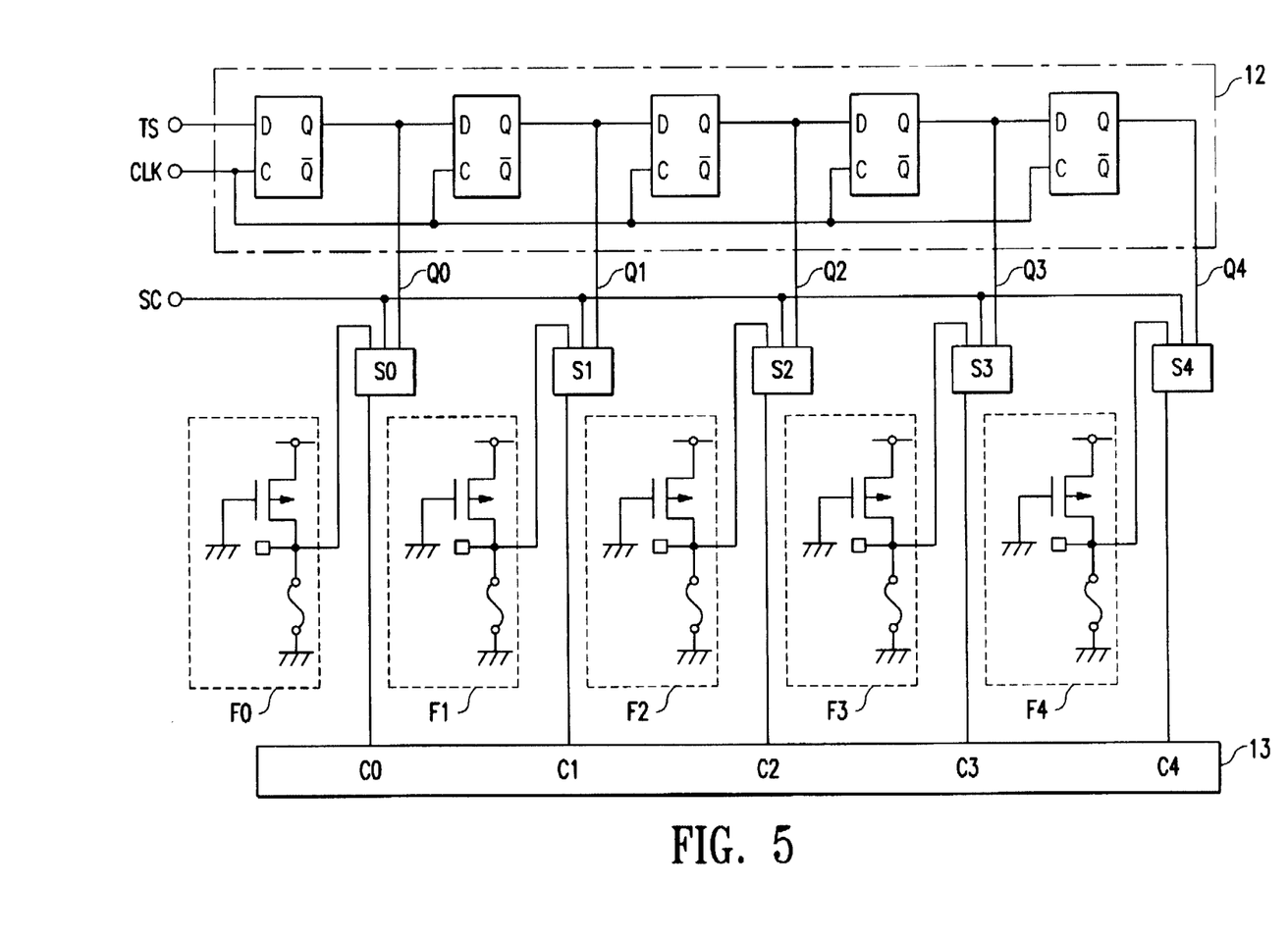
FIG. 5 is a block diagram showing an example a unit employing the circuit shown in FIG. 4.

To explain one specific use of the circuit of Example 2, FIG. 5 shows the circuit arrangement of an input part to adjust the oscillation frequency of an oscillation circuit having a crystal oscillator. In the circuit shown in FIG. 5, reference numeral 12 is a shift register composed of five D-flip-flops connected together in series, and having inputs connected to receive test signals TS and a clock signal CLK. Register 12 outputs five output signals Q0, Q1, Q2, Q3 and Q4 from the Q outputs of respective D-flip-flops in parallel on the basis of clock signals CLK. These output signals Q0, Q1, Q2, Q3 and Q4 are applied to respective select circuits S0, S1, S2, S3 and S4 together with five fuse bits from circuits F0, F1, F2, F3 and F4. Each of the latter circuits F0–F4 is composed of an input terminal 3, a fuse element 4 and a field-effect transistor 5 as shown in FIG. 4.

A common select controlling signal SC is applied to each of the select circuits S0, S1, S2, S3 and S4. Depending on the signal level of select controlling signal SC, either the output signals Q0, Q1, Q2, Q3 and Q4 or the fuse bits from circuits F0, F1, F2, F3 and F4 are selected in the same way as stated above and are introduced to bit inputs C0, C1, C2, C3 and C4 of a logic circuit 13 which is configured for adjusting a pulse rate which controls a dividing stage of an oscillation circuit.

The logic circuit 13 for adjusting pulse rate changes the division ratio of a dividing circuit on the basis of the bit input. For example, it can lead-compensate or delay-compensate a 32.768 kHz oscillation frequency in individual steps depending on the value of the five bits supplied thereto.

Figure 6:
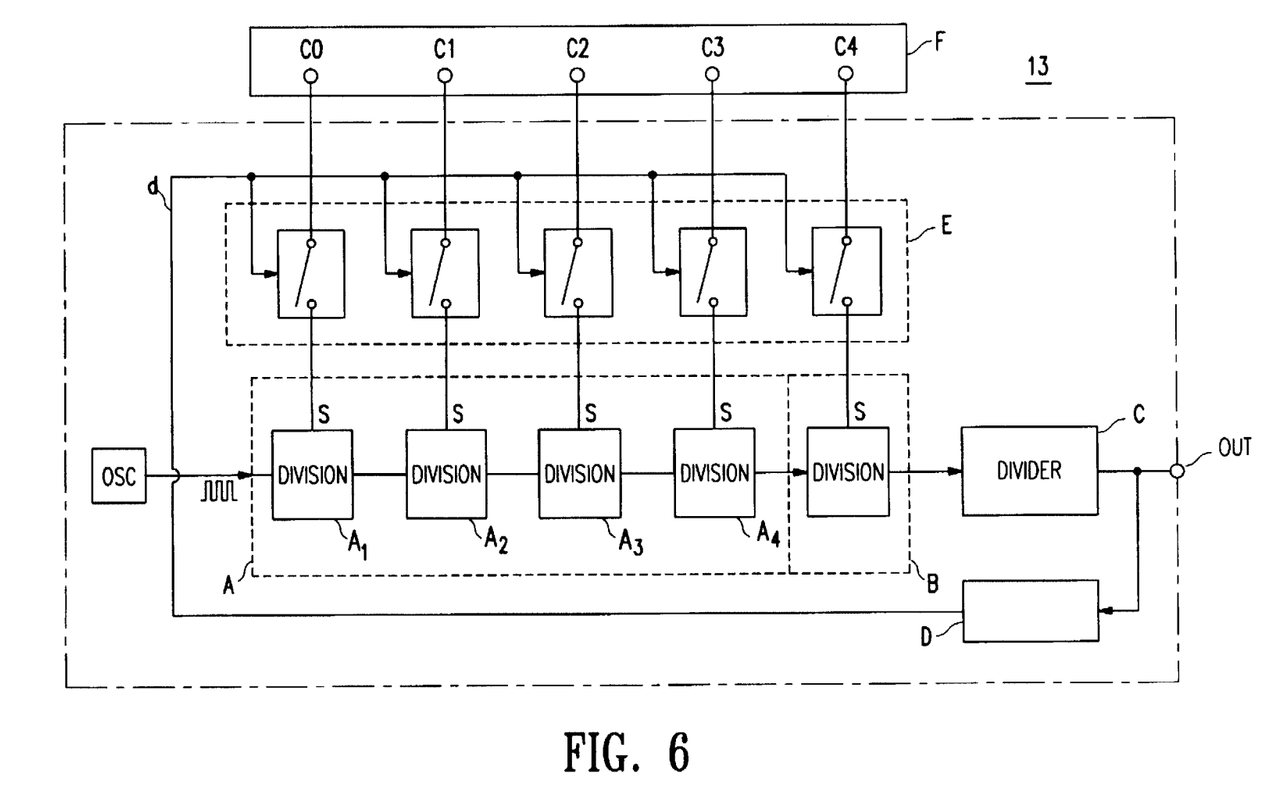
FIG. 6 is a block diagram showing the composition of a logic circuit for adjusting pulse rate and constituting a component of the input part shown in FIG. 5 to adjust a real-time clock.

FIG. 6 shows one suitable embodiment of the logic circuit 13 of FIG. 5 for adjusting pulse rate. In this circuit, on the basis of standard signals generated by a crystal oscillator OSC, clock signals at a rate of one Hz are output on an output terminal OUT through a lead-compensating circuit A composed of four 1:2 dividing stages $A_1$ to $A_4$, a delay-compensating circuit B composed of one 1:2 dividing stage, and a frequency dividing circuit C which may have a dividing ratio of 1:1024. A circuit D generates, on the basis of output clock signals from divider C, a train of controlling pulses d, having a pulse rate equal to that at terminal OUT divided by 10, or 0.1 Hz for instance. The controlling pulses d are input to a control input selection block E having five switch portions each associated with a respective dividing stage $A_1$ to $A_4$ and B. At the moment when a controlling pulse d is input, bit inputs C0, C1, C2 and C3, which are introduced from the input part shown in FIG. 5 to terminal part F (outputs of logic circuit 13 of FIG. 5), are introduced to respective set inputs S of 1:2 dividing stages $A_1$ to $A_4$, and bit input C4 is introduced to the reset input R of the 1:2 dividing stage of delay-compensating circuit B. If a bit input having the logical value "0" is introduced to the set input S of a 1:2 dividing stage $A_1$ to $A_4$, the respective dividing stage $A_1$ to $A_4$ continues dividing the pulse train which it receives; while if a bit input with logical value "1" is introduced, the output from that stage becomes "1" for a certain period and selected lead compensation is carried out. On the other hand, if a bit input having the logical value "0" is introduced to the reset input R of the 1:2 dividing stage of delay-compensating circuit B, the output signals from lead-compensating circuit A are divided by half and are output; if a bit input with logical value "1" is introduced, the output becomes "0" at that point, and the delay compensation is carried out by delay-compensating circuit B.

Figure 61:
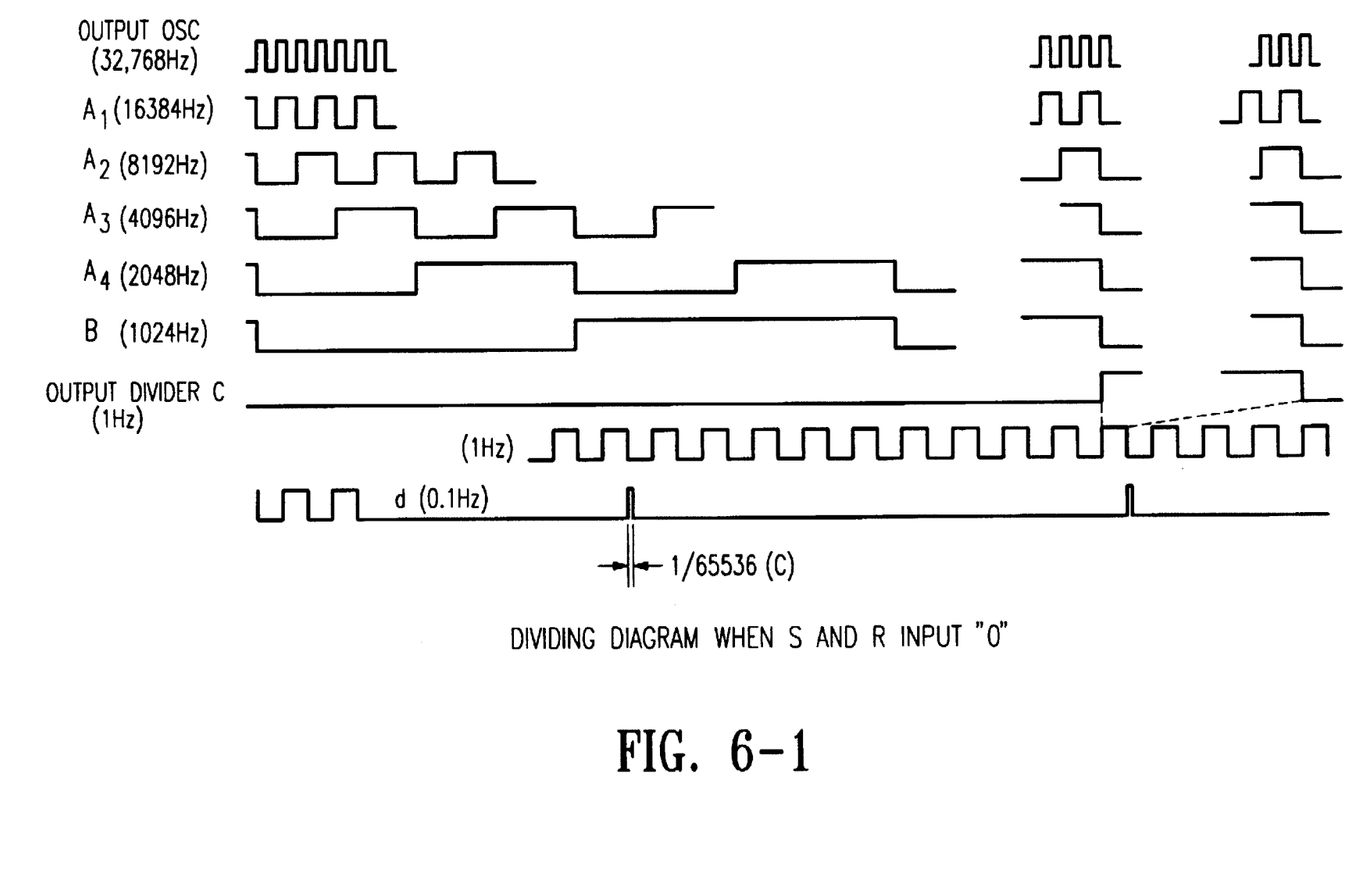
Figure 62:
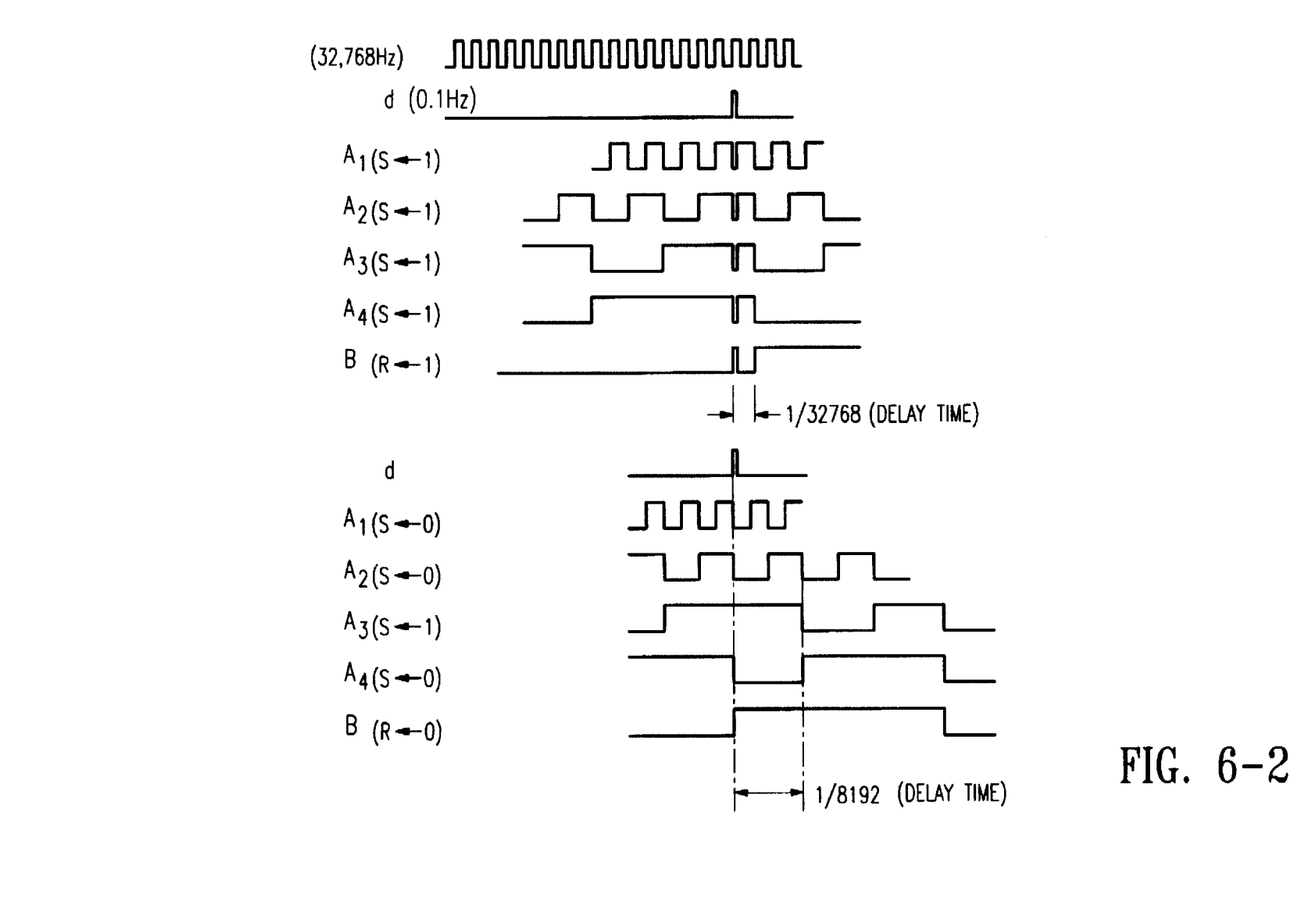

FIG. 6-1 is a waveform diagram illustrating the operation of the circuit of FIG. 6 when a logic "0" is applied from terminal part F to each dividing stage A,B. In this case, no compensation is effected. The upper diagram of FIG. 6-2 shows the effect when a logic "1" is applied to each dividing stage A,B. In this case, the signal pulse from divider B is delayed. When a logic "1" is applied only to divider A3, the pulse from divider B is advanced in time, as shown by the lower diagram of FIG. 6-2.

In the operation of the circuit of FIG. 6, each pulse d has a particular time relation to a pulse of the output of oscillator OSC. Specifically, each pulse d will be timed by suitable circuitry to coincide with the leading edge of an uncompensated pulse at the output of circuit B.

In the example shown in the upper diagram of FIG. 6-2, all of stages A are set to "1" and circuit B is reset to "0" so that the output of circuit B becomes "1" at the next leading edge of the output from OSC. Thus, the appearance of a "1" at the output of circuit B is delayed by $1/32768$ $Hz^{-1}$.

In the example shown in the lower diagram of FIG. 6-2, a pulse d sets the output of stage A3 to "1" after a trailing pulse edge from stage A3 has switched the output state of stage A4 to the "0" level, and as a result the signal at the output of circuit B is switched to the "1" level. Since, however, stage A3 was set to its "1" level when the output signal from circuit B was set to the "1" level, the next transition of the output signal from stage A3 is a "1" to "0" transition which changes the output signal produced by circuit A4. The net result is that the next "1" to "0" transition of the output signal from circuit B is advanced by a time equal to one-half of the normal output signal period of stage A3.

The repetition rate at terminal OUT is varied in very fine steps because a lead or lag compensation is effective only once out of every 1024 pulses from circuit B.

In this way, in a logic circuit for adjusting pulse rate, as shown in Table 1 below, the timing of clock signals can be lead-compensated or delay-compensated at prescribed intervals according to the respective states of bit inputs C0, C1, C2, C3, C4. In an exemplary real-time clock, the oscillation frequency of a crystal oscillator OSC is 32.768 kHz, and when a controlling pulse signal d is output by circuit D at a rate of 0.1 Hz, the lead compensation or delay compensation can be carried out for 3 ppm clock signals for each step of bit input.

TABLE 1

| | Delay | | | | | | | | | | | | | | | |
|---|---|---|---|---|---|---|---|---|---|---|---|---|---|---|---|---|
| | −16 | −15 | −14 | −13 | −12 | −11 | −10 | −0 | −1 | −2 | −3 | −4 | −5 | −6 | −7 | −8 |
| c0 | 0 | 1 | 0 | 1 | 0 | 1 | 0 | 1 | 0 | 1 | 0 | 1 | 0 | 1 | 0 | 1 |
| c1 | 0 | 0 | 1 | 1 | 0 | 0 | 1 | 1 | 0 | 0 | 1 | 1 | 0 | 0 | 1 | 1 |
| c2 | 0 | 0 | 0 | 0 | 1 | 1 | 1 | 1 | 0 | 0 | 0 | 0 | 1 | 1 | 1 | 1 |
| c3 | 0 | 0 | 0 | 0 | 0 | 0 | 0 | 0 | 1 | 1 | 1 | 1 | 1 | 1 | 1 | 1 |
| c4 | 1 | 1 | 1 | 1 | 1 | 1 | 1 | 1 | 1 | 1 | 1 | 1 | 1 | 1 | 1 | 1 |

| | Lead | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| c0 | 0 | 1 | 0 | 1 | 0 | 1 | 0 | 1 | 0 | 1 | 0 | 1 | 0 | 1 | 0 | 1 |
| c1 | 0 | 0 | 1 | 1 | 0 | 0 | 1 | 1 | 0 | 0 | 1 | 1 | 0 | 0 | 1 | 1 |
| c2 | 0 | 0 | 0 | 0 | 1 | 1 | 1 | 1 | 0 | 0 | 0 | 0 | 1 | 1 | 1 | 1 |
| c3 | 0 | 0 | 0 | 0 | 0 | 0 | 0 | 0 | 1 | 1 | 1 | 1 | 1 | 1 | 1 | 1 |
| c4 | 0 | 0 | 0 | 0 | 0 | 0 | 0 | 0 | 0 | 0 | 0 | 0 | 0 | 0 | 0 | 0 |

In this adaptation, the serial data of test signals TS is converted to test signals corresponding to the bit number through shift register 12, and is introduced to the respective bit inputs C0, C1, C2, C3 and C4 of logic circuit 13 for adjusting pulse rate; then, the dependence of an oscillation circuit on frequency is measured. Consequently, the properties of an oscillation circuit, that is to say the correlation of the logic state of logical circuit 13 for adjusting pulse rate and oscillation frequency can be recognized in a very short time. By selecting to melt or not each one of fuse bits F0, F1, F2, F3 and F4 on the basis of the measurement data, even if oscillation circuits vary widely from one another in their dependence on frequency, the frequency can be adjusted with great precision and without any difficulty.

As stated earlier herein, the present invention is characterized in that a semiconductor integrated circuit is provided with an internal adjustment input part containing built-in fuse elements which can be configured to adjust at least one operating property of an internal circuit, that aluminum or an aluminum alloy, which is wiring material, is used as the fuse elements, and that there is a means to select signals and a means to input test signals in the internal adjustment input part. Accordingly, the following effects can be obtained:

The properties of an internal circuit can be adjusted by applying a voltage or an electric current from an external terminal after the assembly of a package. Therefore such internal circuit can always be adjusted optimally without being affected by the property changes of the internal circuit caused by stress such as pressure and temperature and so on in the manufacturing process of a package, particularly in resin sealing.

When a fuse element is formed from wiring material of aluminum or an aluminum alloy, it can be melted stably. Even when there remains a bridge-like part due to incomplete melting, since the resistivity remains much lower than that of a conventional polysilicon layer, a second, complete melting is easily achieved. Moreover, since the fuse element is formed from wiring material, it can be formed simultaneously with a wiring layer without using new material.

By setting the resistance value of a fuse element with a low resistivity at higher than 10 Ω, an electric breakdown rating sufficient for the general external environment can be obtained.

By forming at least one part of a fuse element to have a reduced cross section, the stability of melting of the fuse element can be improved. By forming the part to be melted near the edge of a fuse element which is formed on the margin of a semiconductor integrated circuit, the danger of the destruction of a covering film affecting an internal circuit and so on during melting of a fuse can be minimized.

If a fuse element is formed simultaneously with another wiring layer or layers, the number of manufacturing processes does not increase. Therefore, any significant increase in manufacturing cost can be avoided. The lowest wiring layer of an integrated circuit is thin. Therefore, if a fuse element is formed simultaneously with the lowest wiring layer, the thinnest fuse layer can be obtained without reducing the topological pattern or changing formation time. Consequently, it is possible to obtain the necessary resistance value with the shortest fuse element, and to minimize the area occupied by a fuse element. In setting up a part to be melted on a fuse element formed on a stepped portion formed by LOCOS (selective oxide film), or at a difference in level formed on the border of a polysilicon layer, or on an aluminum wiring layer through an interlayer insulating film and so on, a stepped portion is also formed on the fuse element. Moreover, the stepped portion is made to be thinner than other plane parts of the fuse element. Consequently, a part to be melted can be formed without special shaping of the fuse element part to be melted through, and without increasing formation time, and so on.

By changing a means to select signals on the basis of selection controlling signals, and by operating an internal circuit after introducing test signals from a means to input test signals, it is possible to detect operating data of an internal circuit and to melt one or more fuse elements on the basis of this data. Accordingly, the properties of an internal circuit can be adjusted stably and highly precisely without being much affected by differences between nominally identical internal circuits.

In the case of a semiconductor integrated circuit having multiple fuses and means to select signals, a shift register can be used as the means to input test signals. In this case, after serial signals are input, parallel output can be obtained by the shift register. Accordingly, by inputting only one serial signal as a test signal, a whole range of adjusting data corresponding to multiple adjusting signals can be obtained in a short time.

In an oscillation circuit according to the present invention, a crystal, or quartz, oscillator serving as an oscillation source of a real time clock is sealed, together with an IC chip, in a package. Thereafter, a fine adjustment of the output of the oscillation circuit can be achieved by selective melting of respective fuses. In accordance with the present invention, selective melting of the fuses can serve to adjust the value of a capacitance associated with the oscillation circuit in order to achieve the desired adjustment of the output pulse rate.

Figure 9:
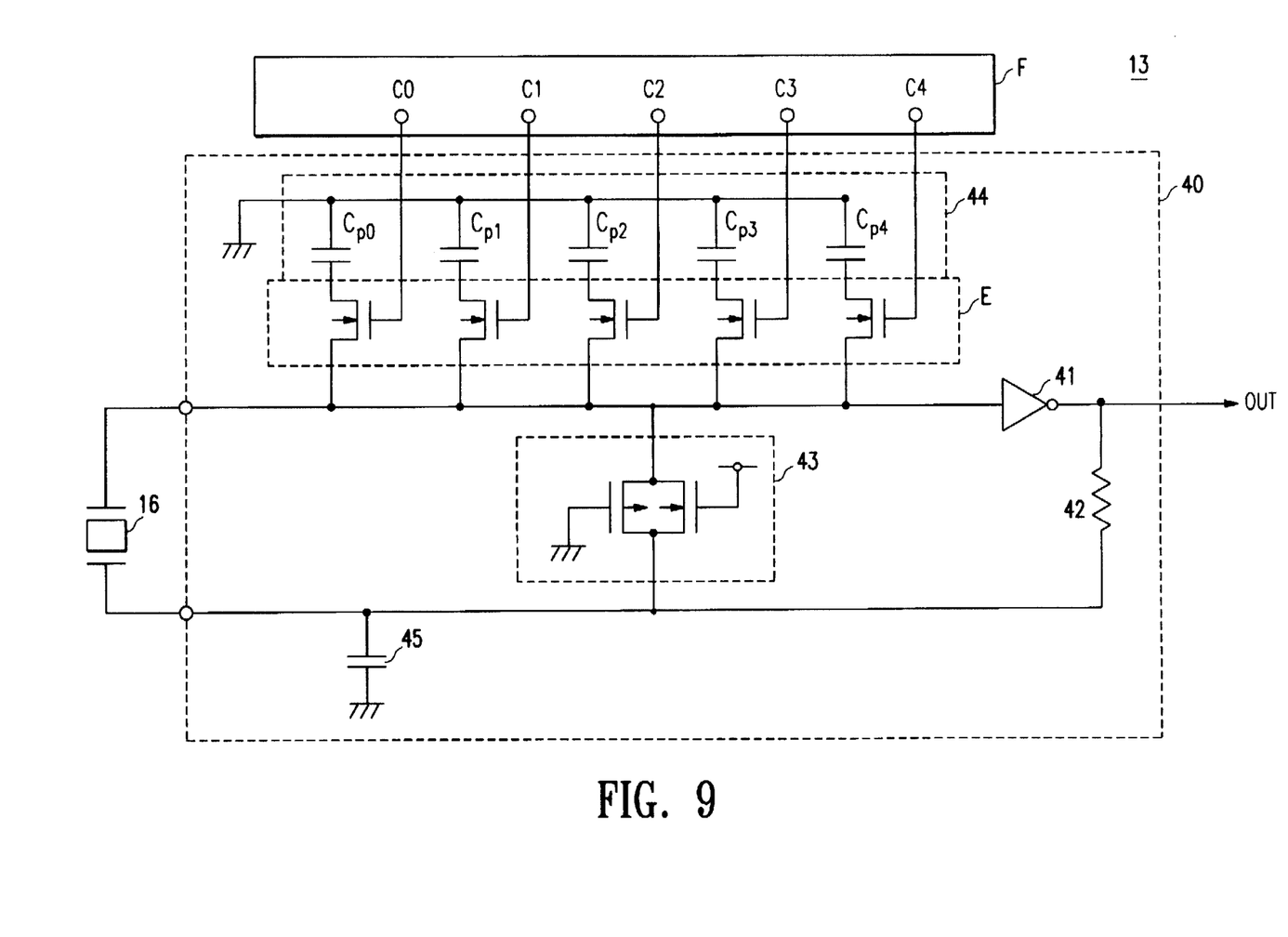
FIG. 9 is a circuit diagram similar to that of FIG. 6 showing another embodiment of a logic circuit according to the present invention for adjusting the repetition rate of a clock pulse train.
Figure 10:
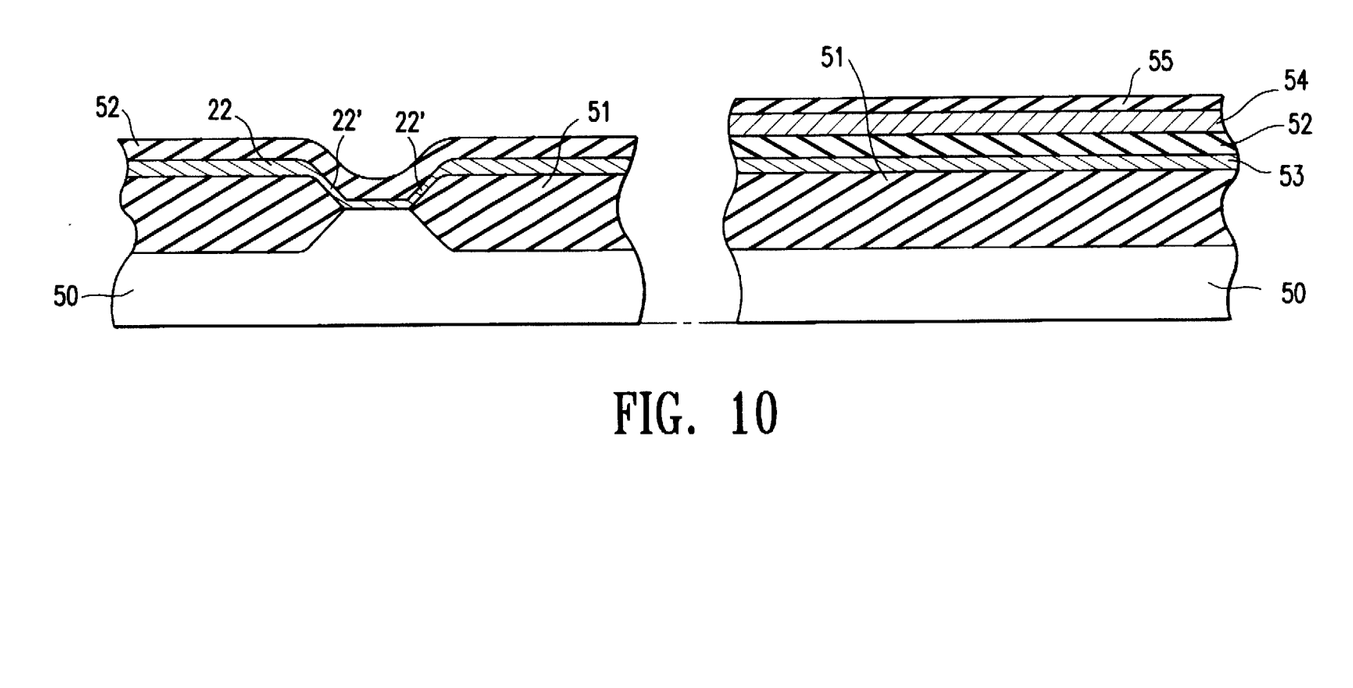
FIG. 10 is a cross-sectional view showing two spaced portions of a semiconductor ship carrying an integrated circuit device according to the invention.

The circuit 40 shown in FIG. 9 is an oscillation circuit having, like the circuit of FIG. 6, a block E containing five switches and a terminal part F constituting the outputs of logic circuit 13 of FIG. 5.

Circuit 40 is connected to receive the output of crystal oscillator 16. Oscillator 16 is typically a quartz oscillator. Circuit 40 further includes an inverting amplifier 41, a drain resistor 42, a feedback resistor 43, a gate capacitance unit 44 and a drain capacitor 45. Drain resistor 42 and feedback resistor 43 are connected in a feedback loop between the output and input of amplifier 41. The point of connection between resistors 42 and 43, and one side of oscillator 16 are connected to ground via capacitor 45.

Capacitance unit 44 is composed of a plurality of capacitors, in this embodiment there being five capacitors $C_{pi}$ (i=0 . . . 4). Each of these capacitors is connected in series between a respective switch of block E and ground. Depending on the number of switches in block E which are conductive, the capacitance between the line connecting oscillator 16 to the input of inverter 41 and ground can be varied in discreet steps.

While all of the capacitors $c_{pi}$ may have the same capacitance, it is preferred that these capacitors have respectively different capacitances. For example, one preferred set of capacitance values is the following: $C_{p0}=1$ pF; $C_{p1}=2$ pF; $C_{p2}=4$ pF; $C_{p3}=8$ pF; and $C_{p4}=16$ pF. In this embodiment, drain capacitor 45 may have a capacitance of 12 pF.

The conductive state of each of the switches in block E is determined by the value of the corresponding bit signal at the respective input Ci of terminal part F. By way of example, if the bit values at inputs C0 and C3 are equal to logic "1", while the bit values at the other inputs are equal to logic "0", only the switches connected to capacitors $C_{p0}$ and $C_{p3}$ will be conductive, so that the capacitance provided between the input to amplifier 41 and ground has a value of 9 pF. It will be recognized that with the specific arrangement described above, the capacitance between the input of amplifier 41 and ground can be varied in steps of 1 pF over a range of 0–22 pF. The value of the gate capacitance may suitably be in the vicinity of 10 pF for achieving fine adjustment. As the capacitance provided by unit 44 increases, the oscillation frequency decreases. With the circuit according to the present invention, a fine frequency adjustment in the range of tens of ppm can be achieved.

While in the embodiment illustrated in FIG. 9 it is the gate capacitance which is variable, it would also be possible to implement the invention with a fixed gate capacitance and a variable drain capacitance, i.e. with units 44 and E connected in place of drain capacitor 45.

In further accordance with the invention, oscillation circuit 40 is formed as a single IC and is encapsulated in molding material along with oscillator 16.

This application relates to subject matter disclosed in Japanese Patent Application No. 132263/90, filed on May 22, 1990, Japanese Patent Application No. 264094/90, filed on Oct. 2, 1990, and Japanese Patent Application No. 78778/91, filed on Apr. 11, 1991, the disclosures of which are incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended

13 claims, rather than the foregoing description, and all changes which come within the meaning and range of equivalency of the claims are therefore intended to be embraced therein.

I claim:

1. A method of manufacturing a semiconductor integrated circuit device on a semiconductor chip having a margin, the device having at least one wiring layer, said semiconductor integrated circuit device comprising: an internal circuit, the internal circuit having a signal input for receiving an input signal and a signal output for providing an output signal, the internal circuit further having an operating characteristic, the operating characteristic having a value which represents the relation between the output signal and the input signal, a plurality of input pads each electrically connected to a first potential source through a high resistance; a source line constituting a second potential source; and an internal adjustment input part comprising a plurality of fuse elements each having two opposed ends via which each said fuse element is electrically connected between a respective input pad and said source line, each said fuse element being formed of one of aluminum and an aluminum alloy, each of said fuse elements being meltable and having a first state when not having been melted and a second state after having been melted and said fuse elements being operatively associated with said internal circuit so that the state of each said fuse element influences the value of the operating characteristic of said internal circuit, said internal adjustment input part comprising a test-signal input means for selectively inputting either test signals or adjustment signals to said internal circuit and signal selecting means for selecting the signals inputted by said test-signal input means, the method comprising the steps of:

sealing said semiconductor integrated circuit device within a body of a packaging material by a sealing process capable of altering the operating characteristic of said internal circuit in an undesired manner; and then, after said step of sealing, inputting a test signal to said test-signal input means;

selecting either said adjusting signals or said test signals introduced from said test-signal input means and outputting selected signals;

supplying said selected signals to said internal circuit; and testing said semiconductor integrated circuit for measuring the value of the operating characteristics; and applying, based on the result of said testing step, a selected one of voltage and current to at least one of said fuse elements to change its resistance between two substantially different values by melting said fuse element for causing said input part to output adjusting signals having a selected one of at least two different states depending on whether said fuse element is melted or not for enabling the operating characteristic of said internal circuit to be adjusted on the basis of the state of said adjusting signals in a manner to compensate for alteration of the operating characteristic caused by the sealing process.

2. The method of claim 1 comprising the preliminary step of forming said at least one fuse element to have a resistance value not lower than 1on when not melted.

3. A semiconductor integrated circuit device manufactured on a semiconductor chip having a margin, the device having at least one wiring layer, said semiconductor integrated device comprising an internal circuit, the internal circuit having a signal input for receiving an input signal and a signal output for providing an output signal, the internal circuit further having an operating characteristic, the oper-

14 ating characteristic having a value which represents the relation between the output signal and the input signal; a plurality of input pads each electrically connected to a first potential source through a high resistance; a source line constituting a second potential source; an internal adjustment input part comprising a plurality of fuse elements each having two opposed ends via which said each fuse element is electrically connected between a respective input pad and said source line, each said fuse element being formed of one of aluminum and aluminum alloy, said internal adjustment input part comprising a test signal input means and signal selecting means, the semiconductor integrated circuit device being manufactured by a process comprising the steps of:

sealing said semiconductor integrated circuit device within a body of a packaging material by a sealing process capable of altering the operating characteristic of said internal circuit in an undesired manner; and then, after said step of sealing, inputting a test signal to said test-signal inputting means;

selecting either said adjusting signals or said test signals introduced from said test-signal inputting means and outputting selected signals;

supplying said selected signals to said internal circuit;

testing said semiconductor integrated circuit device for measuring the operating characteristic and applying, based on the result of said testing step, a selected one of voltage and current to at least one of said fuse elements to change its resistance between two substantially different values by melting said fuse element for causing said input part to output adjusting signals having a selected one of at least two different states depending on whether said fuse element is melted or not for enabling at least one operating characteristic of said internal circuit to be adjusted on the basis of the state of said adjusting signals in a manner to compensate for alteration of the at least one operating characteristic caused by the sealing process.

4. The method of claim 3, wherein said at least one fuse element is formed simultaneously with, and from a part of, said wiring layer and from the same material as said wiring layer.

5. The method of claim 4, wherein said wiring layer is made of one of aluminum and an aluminum alloy.

6. The method of claim 3, wherein the fuse element has a lower resistance value not lower than 10 $\Omega$.

7. A method of manufacturing a semiconductor integrated circuit device on a semiconductor chip having a margin, the device having at least one wiring layer, said semiconductor integrated circuit device comprising: an internal circuit, the internal circuit having a signal input for receiving an input signal and a signal output for providing an output signal, the internal circuit further having an operating characteristic, the operating characteristic having a value which represents the relation between the output signal and the input signal; a plurality of input pads each electrically connected to a first potential source through a high resistance; a source line constituting a second potential source; and an internal adjustment input part comprising a plurality of fuse elements each having two opposed ends via which each said fuse element is electrically connected between a respective input pad and said source line, each said fuse element being formed of one of aluminum and an aluminum alloy, each of said fuse elements being meltable and having a first state when not having been melted and a second state after having been melted and said fuse elements being operatively associated with said internal circuit so that the state of each said fuse element influences the value of the operating characteristic of said internal circuit, the method comprising the steps of:

sealing said semiconductor integrated circuit device within a body of a packaging material by a sealing process capable of altering the operating characteristic of said internal circuit in an undesired manner; and then, after said step of sealing, inputting a test signal one time to said internal circuit for measuring the value of the operating characteristic; and when the measured operating characteristic value differs from the desired value, determining the difference between the measured and desired operating characteristic values, identifying each fuse element that must be melted to minimize the difference, and melting each identified fuse element for enabling the operating characteristic of said internal circuit to be adjusted in a manner to compensate for alteration of the operating characteristic caused by the sealing process.

* * * * *